United States Patent
Cao

(10) Patent No.: US 9,831,297 B2
(45) Date of Patent: Nov. 28, 2017

(54) AMOLED ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventor: Kun Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/121,960

(22) PCT Filed: Nov. 17, 2015

(86) PCT No.: PCT/CN2015/094754
§ 371 (c)(1),
(2) Date: Aug. 26, 2016

(87) PCT Pub. No.: WO2016/107311
PCT Pub. Date: Jul. 7, 2016

(65) Prior Publication Data
US 2017/0069705 A1    Mar. 9, 2017

(30) Foreign Application Priority Data

Dec. 30, 2014    (CN) .......................... 2014 1 0841764

(51) Int. Cl.
*H01L 27/32*    (2006.01)
*H01L 51/52*    (2006.01)
*H01L 51/56*    (2006.01)

(52) U.S. Cl.
CPC .......... *H01L 27/3279* (2013.01); *H01L 27/32* (2013.01); *H01L 27/3246* (2013.01);
(Continued)

(58) Field of Classification Search
CPC . H01L 27/3279; H01L 27/3246; H01L 51/56; H01L 27/3258; H01L 51/52; H01L 27/32
See application file for complete search history.

(56) References Cited

U.S. PATENT DOCUMENTS

| 7,224,118 B2 * | 5/2007 | Yamazaki ........... H01L 51/0562 313/498 |
| 2002/0158835 A1 | 10/2002 | Kobayashi et al. |

FOREIGN PATENT DOCUMENTS

| CN | 103066212 A | 4/2013 |
| CN | 103700694 A | 4/2014 |

(Continued)

OTHER PUBLICATIONS

First Office Action dated Nov. 1, 2016 in Corresponding Chinese Application No. 201410841764.3.
(Continued)

*Primary Examiner* — William Coleman
(74) *Attorney, Agent, or Firm* — Nath, Goldberg & Meyer; Joshua B. Goldberg

(57) ABSTRACT

The present invention relates to an AMOLED array substrate, a manufacturing method thereof and a display device. The AMOLED array substrate includes at least one first auxiliary line provided in the same layer as but not intersecting with pixel electrodes; and at least one second auxiliary line provided in the same layer as source and drain electrodes but not intersecting with data lines and the source and drain electrodes, wherein: projections of the first and second auxiliary lines on plate electrode are within projection of pixel define layer and at least partially overlap; and the first auxiliary line is electrically connected to the second auxiliary line via a first via hole and to the plate electrode via a second via hole formed in pixel define layer, wherein projection of the first via hole on the plate electrode is within overlapped projection of the first and second auxiliary lines.

18 Claims, 1 Drawing Sheet

(52) U.S. Cl.
CPC .......... *H01L 27/3258* (2013.01); *H01L 51/52* (2013.01); *H01L 51/56* (2013.01); *H01L 2227/323* (2013.01); *H01L 2251/5315* (2013.01)

(56) References Cited

FOREIGN PATENT DOCUMENTS

| CN | 103715205 A | 4/2014 |
|---|---|---|
| CN | 104465711 A | 3/2015 |

OTHER PUBLICATIONS

International Search Report dated Feb. 14, 2016 in corresponding International Application No. PCT/CN2015/094754 along with an English translation of the Written Opinion of the International Searching Authority.
Shibusawa, M, et al. "A 17-Inch WXGA Full-Color OLED Display Using the Polymer Ink-Jet Technology", Ieice Transactions on Electronics,86(11) : 2269-2274, 2003.
Park, Sang-Hee Ko, et al. "42.3: Transparent ZnO Thin Film Transistor for the Application of High Aperture Ratio Bottom Emission AM-OLED Display", SID 08 Digest, pp. 629-632, 2008.

\* cited by examiner

US 9,831,297 B2

1

AMOLED ARRAY SUBSTRATE, METHOD FOR MANUFACTURING THE SAME AND DISPLAY DEVICE

This is a National Phase Application filed under 35 U.S.C. 371 as a national stage of PCT/CN2015/094754 filed on Nov. 17, 2015, an application claiming the benefit of Chinese application No. 201410841764.3 filed on Dec. 30, 2014, the content of each of which is hereby incorporated by reference in its entirety.

TECHNICAL FIELD

Embodiments of the present invention relate to the field of display technology, and particularly relates to an active matrix organic light emitting diode (AMOLED) array substrate, a method for manufacturing the AMOLED array substrate and a display device including the AMOLED array substrate.

BACKGROUND

In the design of a top-emission AMOLED panel, because a top electrode of an OLED device needs to be light-transmissive, the top electrode is generally made thin. When size of the panel is increased, in-plane resistance of the top electrode is relatively large. Large in-plane resistance of the top electrode will increase IR drop, and excessive IR drop will lead to nonuniform in-plane brightness, thereby impacting uniformity of a picture. In an AMOLED, the top electrode is generally formed as an integral planar electrode, which is also referred to as plate electrode, and will be referred to as plate electrode in the present invention thereinafter.

SUMMARY

The present invention is provided to improve or increase uniformity of in-plane resistance of a plate electrode of a top-emission AMOLED and decrease the in-plane resistance of the plate electrode.

According to one aspect of embodiments of the present invention, there is provided an AMOLED array substrate, comprising: a plate electrode electrically connected to an electrode lead provided on the periphery of the plate electrode; a plurality of pixel electrodes arranged in an array; an organic light emitting body provided between the plurality of pixel electrodes and the plate electrode; at least one first auxiliary line that is provided in the same layer as the pixel electrodes but does not intersect with the pixel electrodes; and at least one second auxiliary line that is provided in the same layer as source and drain electrodes of the AMOLED array substrate but does not intersect with data lines, the source and drain electrodes of the AMOLED array substrate, wherein: projections of the first auxiliary line and the second auxiliary line on the plate electrode are within projection of a pixel define layer of the AMOLED array substrate on the plate electrode and at least partially overlap with each other; and the first auxiliary line is electrically connected to the second auxiliary line via a first via hole and is electrically connected to the plate electrode via a second via hole formed in the pixel define layer of the AMOLED array substrate, wherein projection of the first via hole on the plate electrode is within overlapped projection of the first auxiliary line and the second auxiliary line.

Optionally, the at least one first auxiliary line includes a plurality of first auxiliary lines, and the plurality of first

2 auxiliary lines are parallel to gate lines of the AMOLED array substrate; the at least one second auxiliary line includes a plurality of second auxiliary lines, and the plurality of second auxiliary lines are parallel to the data lines of the AMOLED array substrate; and projections of the plurality of first auxiliary lines and the plurality of second auxiliary lines on the plate electrode form a mesh pattern including a plurality of meshes.

Further optionally, the pixel electrodes and the meshes of the mesh pattern are in one-to-one correspondence, and projection of each pixel electrode on the plate electrode is within the corresponding mesh of the mesh pattern.

Optionally, projection of the second via hole on the plate electrode is within the overlapped projection of the first auxiliary line and the second auxiliary line, and the projections of the first via hole and the second via hole on the plate electrode overlap.

In the above array substrate, optionally, each first auxiliary line is provided correspondingly to one gate line, and projections of the first auxiliary line and the corresponding gate line on the plate electrode at least partially overlap.

In the above array substrate, optionally, the AMOLED array substrate further includes a passivation layer provided between a layer where the source and drain electrodes are provided and the pixel electrodes, and the first via hole passes through the passivation layer to electrically connect the first auxiliary line to the second auxiliary line.

Further optionally, the AMOLED array substrate further includes a planarization layer provided between the passivation layer and the pixel electrodes, and the first via hole passes through the passivation layer and the planarization layer to electrically connect the first auxiliary line to the second auxiliary line.

In the above array substrate, optionally, the electrode lead is provided around the entire periphery of the plate electrode; and at least one end of each auxiliary line is electrically connected to the electrode lead.

In the above array substrate, optionally, the overlapped projection of the at least one first auxiliary line and the at least one second auxiliary line is at least positioned at a center area of the plate electrode.

According to another aspect of the embodiments of the present invention, there is provided a display device, comprising any one of the above AMOLED array substrates.

According to still another aspect of the embodiments of the present invention, there is provided a method for manufacturing an AMOLED array substrate, wherein the AMOLED array substrate comprises: a plurality of pixel electrodes arranged in an array; a plate electrode electrically connected to an electrode lead provided on the periphery of the plate electrode; and an organic light emitting body provided between the plurality of pixel electrodes and the plate electrode, and the method comprises steps of: forming, in the same layer as the pixel electrodes, at least one first auxiliary line that does not intersect with the pixel electrodes; forming, in the same layer as source and drain electrodes of the AMOLED array substrate, at least one second auxiliary line that does not intersect with date lines, the source and drain electrodes of the AMOLED array substrate, wherein projections of the first auxiliary line and the second auxiliary line on the plate electrode are within projection of a pixel define layer of the AMOLED array substrate on the plate electrode and at least partially overlap with each other; forming a first via hole for electrically connecting the first auxiliary line to the second auxiliary line at a position corresponding to overlapped projection of the first auxiliary line and the second auxiliary line; and forming a second via hole for electrically connecting the second auxiliary line to the plate electrode in the pixel define layer of the AMOLED array substrate.

In the above method, optionally, the step of forming at least one first auxiliary line comprises forming a plurality of first auxiliary lines, such that the plurality of first auxiliary lines are parallel to gate lines of the AMOLED array substrate; and the step of forming at least one second auxiliary line comprises forming a plurality of second auxiliary lines, such that the plurality of second auxiliary lines are parallel to the data lines of the AMOLED array substrate; and projections of the plurality of first auxiliary lines and the plurality of second auxiliary lines on the plate electrode form a mesh pattern including a plurality of meshes.

Further optionally, the pixel electrodes are formed to be in one-to-one correspondence with the meshes of the mesh pattern, and projection of each pixel electrode on the plate electrode is within the corresponding mesh of the mesh pattern formed by the first auxiliary lines and the second auxiliary lines.

In the above method, optionally, the second via hole is formed at a position corresponding to the overlapped projection of the first auxiliary line and the second auxiliary line, and the projections of the first via hole and the second via hole on the plate electrode overlap.

In the above method, optionally, each first auxiliary line is formed correspondingly to a gate line, and projections of the first auxiliary line and the corresponding gate line on the plate electrode at least partially overlap.

In the above method, optionally, a passivation layer is formed between a layer where the source and drain electrodes are provided and the pixel electrodes, and the first via hole passes through the passivation layer to electrically connect the first auxiliary line to the second auxiliary line.

In the above method, optionally, a planarization layer is formed between the passivation layer and the pixel electrodes, and the first via hole passes through the passivation layer and the planarization layer to electrically connect the first auxiliary line to the second auxiliary line.

In the above method, optionally, the first auxiliary line and the pixel electrodes are made of a same material and are simultaneously formed by one patterning process; and the second auxiliary line and the source and drain electrodes are made of a same material and are simultaneously formed by one patterning process.

In the above method, optionally, the method further comprises a step of shielding the second via hole to avoid the organic light emitting body from entering the second via hole, while applying the organic light emitting body.

In the above method, optionally, the electrode lead is provided around the entire periphery of the plate electrode; and the method further comprises a step of electrically connecting at least one end of each auxiliary line to the electrode lead.

In the above method, optionally, the formed at least one first auxiliary line includes the first auxiliary line whose projection on the plate electrode passes a center area of the plate electrode, and the formed at least one second auxiliary line includes the second auxiliary line whose projection on the plate electrode passes the center area of the plate electrode.

The above technical solutions of the present invention achieve the beneficial effects as follows.

In the above technical solutions, the first auxiliary line is electrically connected to the second auxiliary line via the first via hole, and is electrically connected to the plate electrode via the second via hole formed in the pixel define layer of the AMOLED array substrate, so that the resistor network formed by the first and second auxiliary lines is connected in parallel with the plate electrode directly, which can decrease the in-plane resistance of the plate electrode and improve the uniformity of the in-plane resistance of the plate electrode.

DETAILED DESCRIPTION

An AMOLED array substrate, a method for manufacturing the same and a display device provided by embodiments of the present invention will be described in detail below in conjunction with the accompanying drawings.

Sizes and shapes of individual components in the accompanying drawings do not reflect actual scale of the AMOLED array substrate, and is only for the purpose of schematically illustrating contents of the present invention.

Figure 1:
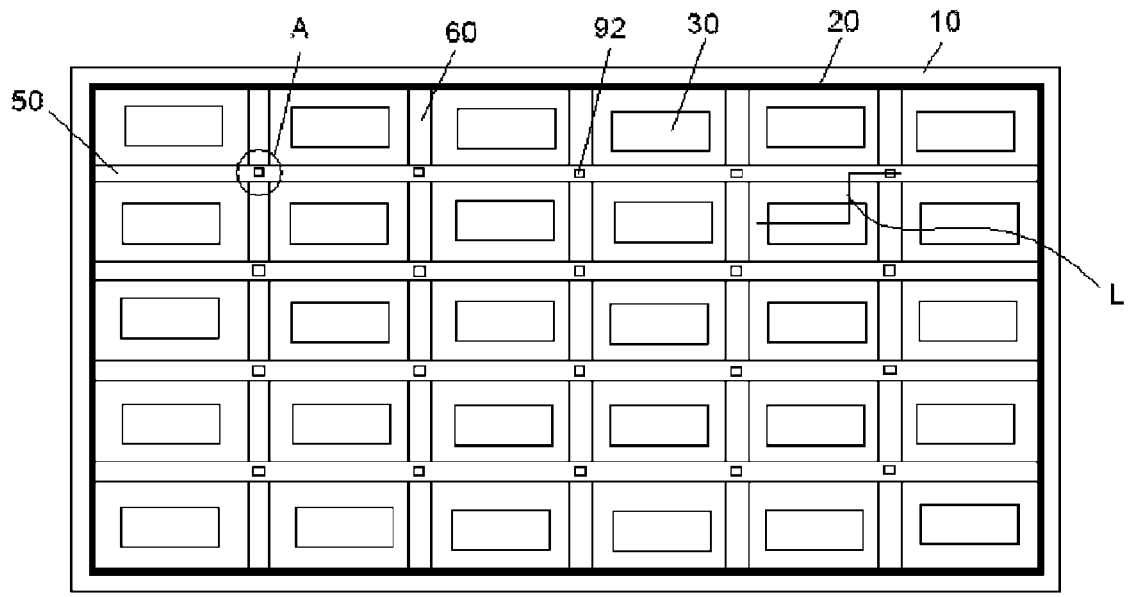
FIG. 1 is a schematic top view of an AMOLED array substrate provided by an exemplary embodiment of the present invention.
Figure 2:
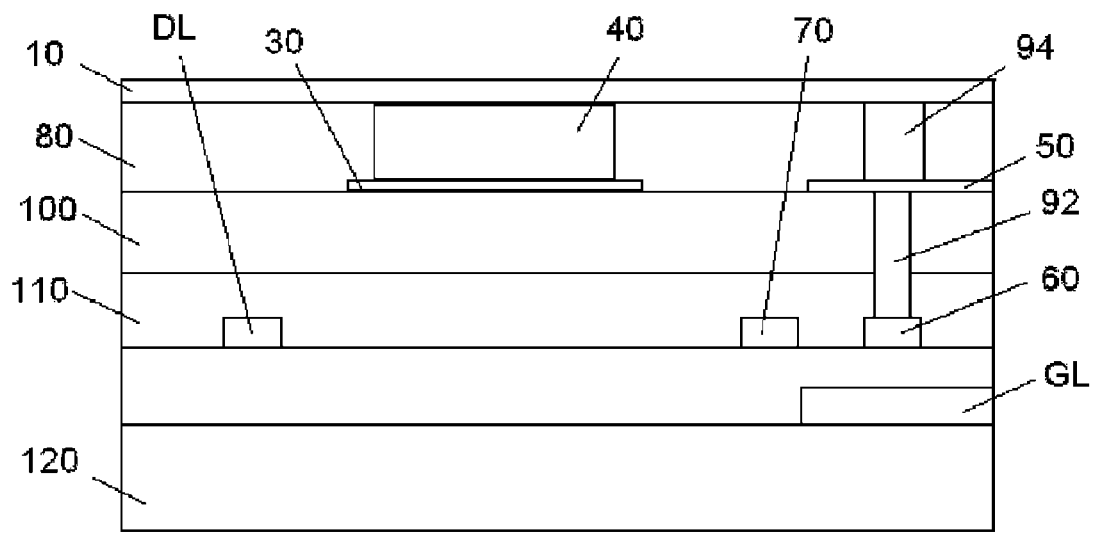
FIG. 2 is a schematic cross-sectional view of the AMOLED array substrate taken along line L in FIG. 1.

As shown in FIGS. 1 and 2, the embodiments of the present invention provide an AMOLED array substrate, including:

a plate electrode 10, which is electrically connected to an electrode lead 20 provided on the periphery of the plate electrode 10;

a plurality of pixel electrodes 30 arranged in an array;

an organic light emitting body 40 provided between the plurality of pixel electrodes 30 and the plate electrode 10;

at least one first auxiliary line 50, which is provided in the same layer as the pixel electrodes 30 but does not intersect with the pixel electrodes; and at least one second auxiliary line 60, which is provided in the same layer as source and drain electrodes of the AMOLED array substrate but does not intersect with data lines DL and the source and drain electrodes of the AMOLED array substrate, wherein:

projections of the first auxiliary line 50 and the second auxiliary line 60 on the plate electrode 10 are within projection of a pixel define layer 80 of the AMOLED array substrate on the plate electrode 10 and at least partially overlap with each other; and the first auxiliary line 50 is electrically connected to the second auxiliary line 60 via a first via hole 92, wherein projection of the first via hole 92 on the plate electrode 10 is within the overlapped projection of the first auxiliary line 50 and the second auxiliary line 60 on the plate electrode 10, and the first auxiliary line 50 is electrically connected to the plate electrode 10 via a second via hole 94 formed in the pixel define layer 80 of the AMOLED array substrate.

As shown in FIG. 2, the AMOLED array substrate further includes a base substrate 120, and all of the above structures are provided on the base substrate 120. The base substrate 120 may be made of glass, transparent resin, quartz, sapphire, or the like, which is not limited in the present invention.

An OLED (organic light emitting diode) in the AMOLED array substrate provided by the embodiments of the present invention may be a common OLED, or a white OLED (WOLED), which is not limited in the present invention.

Further, the plate electrode 10 may serve as the cathode of an OLED, and in this case, the pixel electrode 30 serves as the anode of the OLED; alternatively, the plate electrode 10 may serve as the anode of an OLED, and in this case, the pixel electrode 30 serves as the cathode of the OLED, thereby forming an inverted OLED structure, which is not limited in the present invention and may be chosen according to design requirement of the device.

In the technical solution of the present invention, the first auxiliary line 50 is electrically connected to the second auxiliary line 60 via the first via hole 92, and is electrically connected to the plate electrode 10 via the second via hole 94 formed in the pixel define layer 80 of the AMOLED array substrate, so that the resistor network formed by the first auxiliary line(s) 50 and second auxiliary line(s) 60 is connected in parallel with the plate electrode 10 directly. In this way, the in-plane resistance of the plate electrode 10 can be reduced, and the uniformity of the in-plane resistance of the plate electrode 10 can be improved.

In one example, the at least one first auxiliary line includes a plurality of first auxiliary lines 50, and the first auxiliary lines 50 are parallel to gate lines GL of the AMOLED array substrate; the at least one second auxiliary line includes a plurality of second auxiliary lines 60, and the second auxiliary lines are parallel to the data lines DL of the AMOLED array substrate; and projections of the plurality of first auxiliary lines 50 and the plurality of second auxiliary lines 60 on the plate electrode 10 form a mesh pattern including a plurality of meshes, as shown in FIG. 1. In this case, projections of the first auxiliary lines 50 and the second auxiliary lines 60 on the plate electrode 10 have overlapped portions (intersection points), i.e., the parts indicated by symbol A in FIG. 1, and thereinafter, these intersection points are referred to as projection intersection points.

In this case, both the first auxiliary lines 50 and the second auxiliary lines 60 are substantially evenly distributed, so that electrical connection points between the first auxiliary lines 50 and the plate electrode 10 are substantially evenly distributed, thereby further improving uniformity of the in-plane resistance and uniformity of the in-plane brightness of the entire plate electrode 10.

Needless to say, the first auxiliary lines 50 and the second auxiliary lines 60 may be arranged parallel to each other, which is not limited in the present invention, as long as the projections of the first auxiliary lines 50 on the plate electrode 10 and the projections of the second auxiliary lines 60 on the plate electrode 10 are both within the projection of the pixel define layer 80 on the plate electrode 10 and at least partially overlap, the first auxiliary lines 50 do not intersect with the pixel electrodes 30 provided in the same layer as the first auxiliary lines 50, and the second auxiliary lines 60 do not intersect with the source and drain electrodes provided in the same layer as the second auxiliary lines 60.

Further, in the example shown in FIG. 1, one first auxiliary line 50 is provided correspondingly to each gate line GL, and one second auxiliary line 60 is provided correspondingly to each data line DL. In this case, the pixel electrodes 30 and the meshes of the mesh pattern are in one-to-one correspondence, and projection of each pixel electrode 30 on the plate electrode 10 is within the corresponding mesh of the mesh pattern. In this way, for each pixel structure, the resistor network formed by the plurality of first auxiliary lines 50 and the plurality of second auxiliary lines 60 can electrically contact the plate electrode 10 at four points, so as to ensure uniformity of in-plane resistance of a part of the plate electrode corresponding to each pixel structure.

In an optional embodiment, the second via hole 94 may be provided such that its projection on the plate electrode 10 is within the overlapped projection of the first auxiliary line 50 and the second auxiliary line 60 on the plate electrode 10. In this case, positions where the first via holes 92 and the second via holes 94 are provided correspond to the respective projection intersection points. Further, as shown in FIG. 2, the projections of the first via hole 92 and the second via hole 94 on the plate electrode 10 may overlap. In this way, space of non-light-emitting area of the array substrate can be effectively utilized.

Further preferably, projection intersection points of the first auxiliary lines 50 and the second auxiliary lines 60 include the projection intersection point which is substantially located in a center area of the plate electrode 10 (i.e., the projection intersection points of the first auxiliary lines 50 and the second auxiliary lines 60 are at least substantially located at the center area of the plate electrode 10). In a case that the electrode lead 20 is provided around the entire periphery of the plate electrode 10, the center of the plate electrode 10 is generally the farthest from the electrode lead 20. In this way, the center of the plate electrode 10 is electrically connected with the resistor network formed by the auxiliary lines, which facilitates improving uniformity of the in-plane resistance of the entire plate electrode 10.

It should be noted that, in order to save costs, it is possible to use only one first auxiliary line 50 and only one second auxiliary line 60, and the projection intersection point of the two auxiliary lines is substantially positioned at the center of the plate electrode 10.

It should be noted that, in order to save costs, it may be unnecessary to provide one first auxiliary line 50 correspondingly to each gate line GL, or, the number of the second auxiliary lines 60 in FIG. 2 may be reduced, furthermore, the number of the first auxiliary lines 50 is not necessarily equal to the number of the second auxiliary lines 60. However, to ensure the uniformity of the in-plane resistance of the entire plate electrode 10, both the first auxiliary lines 50 and the second auxiliary lines 60 should be substantially evenly distributed. In this case, projections, on the plate electrode 10, of a plurality of pixel electrodes 30 are within a same mesh of the mesh pattern, that is, the plurality of pixel electrodes 30 correspond to one mesh.

In one example, each first auxiliary line 50 is provided correspondingly to a gate line GL, and projection of the first auxiliary line 50 on the plate electrode 10 and the projection of the corresponding gate line GL on the plate electrode 10 at least partially overlap. In the AMOLED array substrate, gate lines and data lines define pixel structures, thus, by setting the first auxiliary lines 50 and the gate lines GL in an overlapping manner, space occupied by the first auxiliary lines 50 can be reduced as much as possible, i.e., the space of the pixel electrodes 30 is increased, while avoiding electric contact between the first auxiliary lines 50 and the pixel electrodes 30.

As shown in FIG. 2, the AMOLED array substrate may further include a passivation layer 110 provided between a layer 70 where the source and drain electrodes are provided (thereinafter referred to as source and drain electrodes layer 70) and the pixel electrodes 30, and in this case, the first via hole 92 passes through the passivation layer 110 of the AMOLED array substrate to electrically connect the first auxiliary line 50 to the corresponding second auxiliary line 60. Optionally, the AMOLED array substrate may further include a planarization layer 100 provided between the passivation layer 110 and the pixel electrodes 30, and in this case, the first via hole 92 passes through the passivation layer 110 and the planarization layer 100 of the AMOLED array substrate to electrically connect the first auxiliary line 50 to the corresponding second auxiliary line 60.

As shown in FIG. 1, the electrode lead 20 is provided around the entire periphery of the plate electrode 10; and at least one end of each auxiliary line 50/60 is electrically connected to the electrode lead 20. Thus, the resistor network formed by the auxiliary lines 50 and 60 is directly connected with the plate electrode 10 in parallel, which can significantly improve the uniformity of the in-plane resistance of the entire plate electrode 10.

It should be noted that, in the present invention, it is unnecessary to form the via holes 92 and 94 at all positons corresponding to the overlapped projections of the first auxiliary lines 50 and the second auxiliary lines 60 to electrically connect the first auxiliary lines 50 to the second auxiliary lines 60 and connect the first auxiliary lines 50 to the plate electrode 10. The via holes 92 and/or 94 may be formed at a part of positions corresponding to the overlapped projections.

The embodiments of the present invention further provide a display device, which includes the above AMOLED array substrate. The display device may be any product or component having a display function, such as an OLED panel, a mobile phone, a tablet computer, a television, a display, a notebook computer, a digital frame, a navigator, or the like. Based on the above AMOLED array substrate, in-plane resistance of the plate electrode 10 can be reduced, uniformity of the in-plane resistance of the entire plate electrode 10 can be improved, and thus display performance of the display panel can be improved.

In the technical solution of the present invention, the first auxiliary line 50 is electrically connected to the second auxiliary line 60 via the first via hole 92, and is electrically connected to the plate electrode 10 via the second via hole 94 formed in the pixel define layer 80 of the AMOLED array substrate, so that the resistor network formed by the first auxiliary lines 50 and the second auxiliary lines 60 is directly connected with the plate electrode 10 in parallel.

The embodiments of the present invention further provide a method for manufacturing an AMOLED array substrate having the above characteristics. The AMOLED array substrate comprises: a plurality of pixel electrodes arranged in an array; a plate electrode connected to an electrode lead provided on the periphery of the plate electrode; and an organic light emitting body provided between the plurality of pixel electrodes and the plate electrode.

The method for manufacturing the AMOLED array substrate according to the present invention may include the following steps:

forming, in the same layer as the pixel electrodes 30 at least one first auxiliary line 50 that does not intersect with the pixel electrodes 30;

forming, in the same layer as source and drain electrodes of the AMOLED array substrate, at least one second auxiliary line 60 that does not intersect with date lines DL and the source and drain electrodes of the AMOLED array substrate, wherein projections of the first auxiliary line 50 and the second auxiliary line 60 on the plate electrode 10 are within projection of a pixel define layer 80 of the AMOLED array substrate on the plate electrode 10 and at least partially overlap with each other;

forming a first via hole 92 for electrically connecting the first auxiliary line 50 to the second auxiliary line 60 at a position corresponding to the overlapped projection of the first auxiliary line 50 and the second auxiliary line 60; and forming, in the pixel define layer of the AMOLED array substrate, a second via hole 94 for electrically connecting the first auxiliary line 50 to the plate electrode 10.

In the above method, a plurality of first auxiliary lines 50 and a plurality of second auxiliary lines 60 may be formed, such that the first auxiliary lines 50 are parallel to gate lines GL of the AMOLED array substrate, the second auxiliary lines 60 are parallel to the data lines DL of the AMOLED array substrate, and projections of the plurality of first auxiliary lines 50 and the plurality of second auxiliary lines 60 on the plate electrode 10 form a mesh pattern including a plurality of meshes. In this case, both the first auxiliary lines 50 and the second auxiliary lines 60 are substantially evenly distributed, so that electrical connection points between the first auxiliary lines 50 and the plate electrode 10 are substantially evenly distributed, thereby further improving uniformity of the in-plane resistance of the entire plate electrode 10.

Further, the pixel electrodes 30 are formed to be in one-to-one correspondence with the meshes of the mesh pattern, and projection of each pixel electrode on the plate electrode 10 is within the corresponding mesh of the mesh pattern formed by the first auxiliary lines 50 and the second auxiliary lines 60. In this way, for each pixel structure, the resistor network formed by the plurality of first auxiliary lines 50 and the plurality of second auxiliary lines 60 can electrically contact the plate electrode 10 at four points, so as to ensure uniformity of in-plane resistance of the plate electrode corresponding to each pixel structure.

In the above method, in an optional embodiment, the second via hole 94 may also be formed at a position corresponding to the overlapped projection of the first auxiliary line 50 and the second auxiliary line 60. In this case, the positions where the first via holes 92 and the second via holes 94 are provided correspond to the projection intersection points. Further, as shown in FIG. 2, the projections of the first via hole 92 and the second via hole 94 on the plate electrode 10 may overlap. Thus, space of non-light-emitting area of the AMOLED array substrate can be effectively utilized.

Further optionally, the formed at least one first auxiliary line includes a first auxiliary line whose projection on the plate electrode passes through a center area of the plate electrode, and the formed at least one second auxiliary line includes a second auxiliary line whose projection on the plate electrode passes through the center area of the plate electrode. In this way, projection intersection points of the first auxiliary lines 50 and the second auxiliary lines 60 include a projection intersection point which is substantially located in the center area of the plate electrode 10. In a case that the electrode lead 20 is provided around the entire periphery of the plate electrode 10, the center of the plate electrode 10 is generally the farthest from the electrode lead 20. The center of the plate electrode 10 is electrically connected with the resistor network formed by the auxiliary lines 50 and 60, which facilitates improving uniformity of the in-plane resistance of the entire plate electrode 10.

In the above method, in an optional embodiment, each first auxiliary line 50 is formed correspondingly to a gate line GL, and projections of the first auxiliary line 50 and the corresponding gate line GL on the plate electrode 10 at least partially overlap. In the AMOLED array substrate, gate lines GL and data lines DL define pixel structures, thus, by setting the first auxiliary lines 50 and the gate lines GL in an overlapping manner, the space in the non-display area occupied by the first auxiliary lines 50 can be reduced as much as possible, i.e., the space of the pixel electrodes 30 is increased, while avoiding electric contact between the first auxiliary lines 50 and the pixel electrodes 30.

In the above method, as shown in FIG. 2, a passivation layer 110 may be formed between the source and drain electrodes layer 70 and the pixel electrodes 30, and in this case, the first via hole 92 passes through the passivation layer 110 of the AMOLED array substrate to electrically connect the first auxiliary line 50 to the second auxiliary line 60. In an optional embodiment, a planarization layer 100 may be further formed between the passivation layer 110 and the pixel electrodes 30, and in this case, the first via hole 92 passes through the passivation layer 110 and the planarization layer 100 of the AMOLED array substrate to electrically connect the first auxiliary line 50 to the second auxiliary line 60.

In the above method, in order to save costs, the first auxiliary line(s) 50 and the pixel electrodes 30 are made of a same material and are simultaneously formed by one patterning process; and the second auxiliary line(s) 60 and the source and drain electrodes layer 70 are made of a same material, and the second auxiliary line(s) 60 and the source and drain electrodes are simultaneously formed by one patterning process. The patterning process may generally include photoresist application, exposure, development, etching, photoresist stripping, and the like; needless to say, in practice, there are cases that patterning is performed without using a mask, for example, there may be other patterning method in which there is no need to adopt a mask, such as printing or the like, and any process that can form the required pattern can be referred to as the patterning process, which is not limited in the present invention.

As is known by those skilled in the art, when forming the first auxiliary line 50, the material for forming the first auxiliary line 50 may enter into the first via hole 92, resulting in that the first auxiliary line 50 is electrically connected to the second auxiliary line 60 under the first via hole 92. When forming the plate electrode 10, the material for forming the plate electrode 10 may enter into the second via hole 94, resulting in that the plate electrode 10 is electrically connected to the first auxiliary line 50 under the second via hole 94 and thus also electrically connected to the second auxiliary line 60.

The above method may further include a step of shielding, while applying the organic light emitting body 40, the second via hole 94 to avoid the organic light emitting body 40 from entering into the second via hole 94.

In the above method, in the case that the electrode lead 20 is provided around the entire periphery of the plate electrode 10, the method further comprises a step of electrically connecting at least one end of each auxiliary line to the electrode lead 20. In this way, the resistor network formed by the auxiliary lines is directly connected with the plate electrode 10 in parallel, thereby significantly improving the uniformity of the in-plane resistance of the entire plate electrode 10.

Obviously, those of ordinary skill in the art can make various modifications and variations to the present invention without departing from the spirit and scope of the present invention. If these modifications and variations made to the present invention fall into the scope defined by the appended claims of the present invention and equivalents thereof, the present invention is intended to encompass these modifications and variations.

What is claimed is:

1. An AMOLED array substrate, comprising:
   a plate electrode, which is electrically connected to an electrode lead provided on the periphery of the plate electrode;
   a plurality of pixel electrodes arranged in an array;
   an organic light emitting body, which is provided between the plurality of pixel electrodes and the plate electrode;
   at least one first auxiliary line, which is provided in the same layer as the pixel electrodes but does not intersect with the pixel electrodes; and
   at least one second auxiliary line, which is provided in the same layer as source and drain electrodes of the AMOLED array substrate but does not intersect with data lines and the source and drain electrodes of the AMOLED array substrate,
   wherein:
   projections of the first auxiliary line and the second auxiliary line on the plate electrode are within projection of a pixel define layer of the AMOLED array substrate on the plate electrode and at least partially overlap with each other;
   the first auxiliary line is electrically connected to the second auxiliary line via a first via hole and is electrically connected to the plate electrode via a second via hole formed in the pixel define layer of the AMOLED array substrate, wherein projection of the first via hole on the plate electrode is within overlapped projection of the first auxiliary line and the second auxiliary line; and
   projection of the second via hole on the plate electrode is within the overlapped projection of the first auxiliary line and the second auxiliary line, and the projection of the first via hole on the plate electrode is completely within the projection of the second via hole on the plate electrode.

2. The AMOLED array substrate according to claim 1, wherein,
   the at least one first auxiliary line includes a plurality of first auxiliary lines, and the first auxiliary lines are parallel to gate lines of the AMOLED array substrate;
   the at least one second auxiliary line includes a plurality of second auxiliary lines, and the second auxiliary lines are parallel to the data lines of the AMOLED array substrate; and
   projections of the plurality of first auxiliary lines and the plurality of second auxiliary lines on the plate electrode form a mesh pattern including a plurality of meshes.

3. The AMOLED array substrate according to claim 1, wherein,
   each first auxiliary line is provided correspondingly to one gate line, and projections of the first auxiliary line and the corresponding gate line on the plate electrode at least partially overlap.

4. The AMOLED array substrate according to claim 1, wherein,
   the AMOLED array substrate further includes a passivation layer provided between a layer where the source and drain electrodes are provided and the pixel electrodes, and the first via hole passes through the passivation layer to electrically connect the first auxiliary line to the second auxiliary line.

5. The AMOLED array substrate according to claim 1, wherein,
   the electrode lead is provided around the entire periphery of the plate electrode; and
   at least one end of each auxiliary line is electrically connected to the electrode lead.

6. The AMOLED array substrate according to claim 1, wherein,
   the overlapped projection of the at least one first auxiliary line and the at least one second auxiliary line is at least positioned at a center area of the plate electrode.

7. A display device, comprising the AMOLED array substrate according to claim 1.

8. The AMOLED array substrate according to claim 2, wherein,
the pixel electrodes and the meshes of the mesh pattern are in one-to-one correspondence, and projection of each pixel electrode on the plate electrode is within the corresponding mesh of the mesh pattern.

9. The AMOLED array substrate according to claim 4, wherein,
the AMOLED array substrate further includes a planarization layer provided between the passivation layer and the pixel electrodes, and the first via hole passes through the passivation layer and the planarization layer to electrically connect the first auxiliary line to the second auxiliary line.

10. A method for manufacturing an AMOLED array substrate, wherein:
the AMOLED array substrate comprises:
a plurality of pixel electrodes arranged in an array;
a plate electrode electrically connected to an electrode lead provided on the periphery of the plate electrode; and
an organic light emitting body provided between the plurality of pixel electrodes and the plate electrode, and
the method comprises steps of:
forming, in the same layer as the pixel electrodes, at least one first auxiliary line that does not intersect with the pixel electrodes;
forming, in the same layer as source and drain electrodes of the AMOLED array substrate, at least one second auxiliary line that does not intersect with date lines and the source and drain electrodes of the AMOLED array substrate, wherein projections of the first auxiliary line and the second auxiliary line on the plate electrode are within projection of a pixel define layer of the AMOLED array substrate on the plate electrode and at least partially overlap with each other;
forming a first via hole for electrically connecting the first auxiliary line to the second auxiliary line at a position corresponding to overlapped projection of the first auxiliary line and the second auxiliary line; and
forming, in the pixel define layer of the AMOLED array substrate, a second via hole for electrically connecting the second auxiliary line to the plate electrode, wherein the second via hole is formed at a position corresponding to the overlapped projection of the first auxiliary line and the second auxiliary line, and the projection of the first via hole on the plate electrode is completely within the projection of the second via hole on the plate electrode.

11. The method according to claim 10, wherein,
the step of forming at least one first auxiliary line comprises forming a plurality of first auxiliary lines, such that the first auxiliary lines are parallel to gate lines of the AMOLED array substrate; and
the step of forming at least one second auxiliary line comprises forming a plurality of second auxiliary lines, such that the second auxiliary lines are parallel to the data lines of the AMOLED array substrate, and projections of the plurality of first auxiliary lines and the plurality of second auxiliary lines on the plate electrode form a mesh pattern including a plurality of meshes.

12. The method according to claim 10, wherein,
each first auxiliary line is formed correspondingly to one gate line, and projections of the first auxiliary line and the corresponding gate line on the plate electrode at least partially overlap.

13. The method according to claim 10, further comprising a step of:
forming a passivation layer between a layer where the source and drain electrodes are provided and the pixel electrodes, wherein the first via hole passes through the passivation layer to electrically connect the first auxiliary line to the second auxiliary line.

14. The method according to claim 10, wherein,
the first auxiliary line and the pixel electrodes are made of a same material and are simultaneously formed by one patterning process; and
the second auxiliary line and the source and drain electrodes are made of a same material and are simultaneously formed by one patterning process; and
optionally, the method further comprises a step of:
shielding the second via hole to avoid the organic light emitting body from entering the second via hole, while applying the organic light emitting body.

15. The method according to claim 10, wherein,
the electrode lead is provided around the entire periphery of the plate electrode; and
the method further comprises a step of electrically connecting at least one end of each auxiliary line to the electrode lead.

16. The method according to claim 10, wherein,
the formed at least one first auxiliary line includes the first auxiliary line whose projection on the plate electrode passes a center area of the plate electrode, and the formed at least one second auxiliary line includes the second auxiliary line whose projection on the plate electrode passes the center area of the plate electrode.

17. The method according to claim 11, wherein,
the pixel electrodes are formed to be in one-to-one correspondence with the meshes of the mesh pattern, and projection of each pixel electrode on the plate electrode is within the corresponding mesh of the mesh pattern formed by the first auxiliary lines and the second auxiliary lines.

18. The method according to claim 13, further comprising a step of:
forming a planarization layer between the passivation layer and the pixel electrodes, wherein the first via hole passes through the passivation layer and the planarization layer to electrically connect the first auxiliary line to the second auxiliary line.

* * * * *